(12) United States Patent
Wang

(10) Patent No.: US 10,923,542 B2
(45) Date of Patent: Feb. 16, 2021

(54) DISPLAY SCREEN ASSEMBLY HAVING A FLEXIBLE CIRCUIT BOARD WITH CURVED PORTIONS

(71) Applicant: Wuhan China Star Optoelectronics Semiconductor Display Technology Co., Ltd., Wuhan (CN)

(72) Inventor: Chaoliang Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/332,365

(22) PCT Filed: Dec. 29, 2018

(86) PCT No.: PCT/CN2018/125429
§ 371 (c)(1),
(2) Date: Mar. 12, 2019

(87) PCT Pub. No.: WO2020/113735
PCT Pub. Date: Jun. 11, 2020

(65) Prior Publication Data
US 2020/0185464 A1    Jun. 11, 2020

(30) Foreign Application Priority Data
Dec. 5, 2018    (CN) .......................... 2018 1 1476982

(51) Int. Cl.
*H01L 27/32* (2006.01)
*H05K 1/18* (2006.01)
*H05K 1/02* (2006.01)
*G06F 3/041* (2006.01)
*H05K 1/14* (2006.01)

(52) U.S. Cl.
CPC ........ *H01L 27/3244* (2013.01); *G06F 3/0412* (2013.01); *H01L 27/323* (2013.01); *H05K 1/0283* (2013.01); *H05K 1/14* (2013.01); *H05K 1/189* (2013.01); *H05K 2201/058* (2013.01); *H05K 2201/10128* (2013.01)

(58) Field of Classification Search
CPC .................................................. H01L 27/3244
USPC ......................................................... 345/173
See application file for complete search history.

(56) References Cited

U.S. PATENT DOCUMENTS

2016/0126999 A1* 5/2016 Endo .................... H04B 1/3883
455/572
2016/0313838 A1* 10/2016 Lee ........................ G06F 3/0412
(Continued)

FOREIGN PATENT DOCUMENTS

| CN | 102635831 | 8/2012 |
| CN | 202581103 | 12/2012 |
| CN | 203912310 | 10/2014 |

(Continued)

*Primary Examiner* — Long D Pham

(57) ABSTRACT

A display module includes a display module, the display module includes a display panel and a touch panel disposed on the display panel, the display module has a first end; a first flexible circuit board is disposed at the first end of the display module; a second flexible circuit board is disposed at the first end of the display module, wherein the second flexible circuit board is disposed on a side of the first flexible circuit board, and the second flexible circuit board includes a plurality of curved portions.

16 Claims, 2 Drawing Sheets

(56) References Cited

U.S. PATENT DOCUMENTS

2017/0242457 A1 8/2017 Lee et al.
2019/0014664 A1* 1/2019 Ahn ...................... H05K 1/147

FOREIGN PATENT DOCUMENTS

| CN | 107102762 | 8/2017 |
| CN | 206725910 | 12/2017 |
| CN | 108770184 | 11/2018 |

* cited by examiner

DISPLAY SCREEN ASSEMBLY HAVING A FLEXIBLE CIRCUIT BOARD WITH CURVED PORTIONS

RELATED APPLICATIONS

This application is a National Phase of PCT Patent Application No. PCT/CN2018/125429 having International filing date of Dec. 29, 2018, which claims the benefit of priority of Chinese Patent Application No. 201811476982.6 filed on Dec. 5, 2018. The contents of the above applications are all incorporated by reference as if fully set forth herein in their entirety.

FIELD AND BACKGROUND OF THE INVENTION

The present invention relates to a field of display technologies, and in particular, to a display screen assembly.

In recent years, active matrix organic light emitting diode (AMOLED) display screens are usually produced in two ways, one is to set a touch panel in a display on a cell, and the other is to attach a main circuit board to an external circuit board.

In prior art, when the external circuit board is combined with the main circuit board, it is usually required to connect the external circuit board with the main circuit board, followed by bending the external circuit board and the main circuit board. Because the external circuit board is radially outward when bent, the length of the external circuit board needs to be longer than the length of the main circuit board. Due to the greater length of the external circuit board than the length of the main circuit board, when they are connected, the external circuit board may bulge, so that the arch height of the external circuit board may exceed a surface of the touch panel. Therefore, it is easy to cause damage to the external circuit board in the subsequent manufacturing process.

Therefore, there is urgent need for an improved technique to solve the above drawbacks in prior art.

SUMMARY OF THE INVENTION

The embodiment of the present invention provides a display screen assembly, which can reduce the arch height of a second flexible circuit board.

An embodiment of the present invention provides a display screen assembly, including:

a display module, including a display panel and a touch panel disposed on the display panel, the display module having a first end; a first flexible circuit board disposed at the first end of the display module, and electrically connected to the display panel to drive the display panel to realize a display function; and a second flexible circuit board disposed at the first end of the display module, and electrically connected to the touch panel to drive the touch panel to realize a touch function; wherein the second flexible circuit board is disposed at one side of the first flexible circuit board, and the second flexible circuit board includes a plurality of curved portions.

In the display screen assembly provided by an embodiment of the present invention, the second flexible circuit board extends in a squiggly manner along a horizontal direction from the first end.

In the display screen assembly provided by an embodiment of the present invention, both ends of each of the curved portions are close to the first flexible circuit board, and a center of each of the curved portions is away from the first flexible circuit board.

In the display screen assembly provided by an embodiment of the present invention, both ends of each of the curved portions are away from the first flexible circuit board, and a center of each of the curved portions is close to the first flexible circuit board.

In the display screen assembly provided by an embodiment of the present invention, both ends of at least one of the curved portions are away from the first flexible circuit board, and a center of the at least one of the curved portions is close to the first flexible circuit board, while both ends of at least another one of the curved portions are close to the first flexible circuit board, and a center of the at least another one of the curved portions is away from the first flexible circuit board.

In the display screen assembly provided by an embodiment of the present invention, a height of the second flexible circuit board is less than or equal to a thickness of the touch panel.

In the display screen assembly provided by an embodiment of the present invention, a length of the second flexible circuit board is equal to a length of the first flexible circuit board.

In the display screen assembly provided by an embodiment of the present invention, the length of the second flexible circuit board after stretching is greater than the length of the first flexible circuit board.

In the display screen assembly provided by an embodiment of the present invention, the second flexible circuit board further includes a non-curved portion.

In the display screen assembly provided by an embodiment of the present invention, the non-curved portion is adjacent to a side of the first end.

An embodiment of the present invention further provides a display screen assembly, including: a display module, including a display panel and a touch panel disposed on the display panel, the display module having a first end; a first flexible circuit board disposed at the first end of the display module, and electrically connected to the display panel to drive the display panel to realize a display function; and a second flexible circuit board disposed at the first end of the display module, and electrically connected to the touch panel to drive the touch panel to realize a touch function; wherein the second flexible circuit board is disposed at one side of the first flexible circuit board, and the second flexible circuit board includes a plurality of curved portions and two non-curved portions, and the plurality of the curved portions are disposed between the two non-curved portions.

In the display screen assembly provided by an embodiment of the present invention, the second flexible circuit board extends in a squiggly manner along a horizontal direction from the first end.

In the display screen assembly provided by an embodiment of the present invention, both ends of each of the bent portions are close to the first flexible circuit board, and a center of each of the bent portions is away from the first flexible circuit board.

In the display screen assembly provided by an embodiment of the present invention, both ends of each of the curved portions are away from the first flexible circuit board, and a center of each of the curved portions is adjacent to the first flexible circuit board.

In the display screen assembly provided by an embodiment of the present invention, both ends of at least one of the bent portions are away from the first flexible circuit board, and a center of at least one of the bent portions is adjacent to the first flexible circuit board, at least another Both ends of one of the bent portions are adjacent to the first flexible circuit board, and a center of at least another of the bent portions is away from the first flexible circuit board.

In the display screen assembly provided by an embodiment of the present invention, a height of the second flexible circuit board is less than or equal to a thickness of the touch panel.

In the display screen assembly provided by an embodiment of the present invention, a length of the second flexible circuit board is the same as a length of the first flexible circuit board.

In the display screen assembly provided by an embodiment of the present invention, the length of the second flexible circuit board after stretching is greater than the length of the first flexible circuit board.

The display module of the embodiment of the present invention includes a display module, including a display panel and a touch panel disposed on the display panel, the display module having a first end; a first flexible circuit board disposed at the first end of the display module, and electrically connected to the display panel to drive the display panel to realize a display function; and a second flexible circuit board disposed at the first end of the display module, and electrically connected to the touch panel to drive the touch panel to realize a touch function; wherein the second flexible circuit board is disposed at one side of the first flexible circuit board, and the second flexible circuit board includes a plurality of curved portions. Because the second flexible circuit board includes a plurality of curved portions, the arch height of the second flexible circuit board can be reduced when the first flexible circuit board and the second flexible circuit board are connected.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

An embodiment of the present invention provides a display screen assembly for use in a manufacturing process of a display screen component of a display device, such as a smart wearable device, a smart phone, a tablet computer, or a smart TV.

Figure 1:
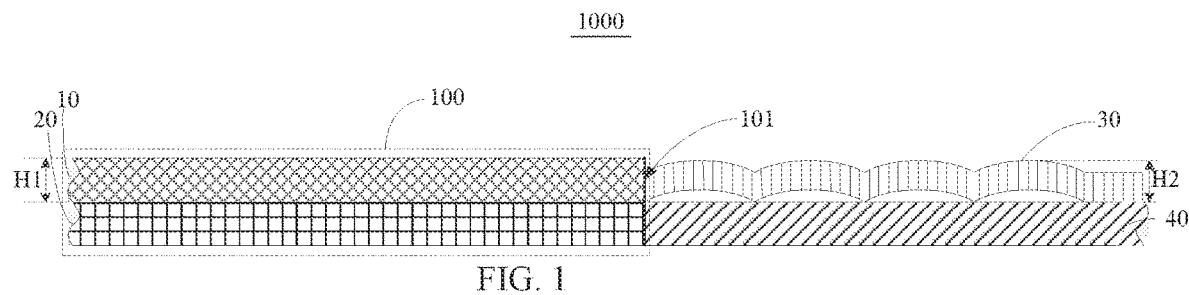
FIG. 1 is a schematic structural view of a display screen assembly provided by a first embodiment of the present invention.

Please refer to FIG. 1. FIG. 1 is a schematic structural diagram of a display screen assembly according to a first embodiment of the present invention. The embodiment of the present invention provides a display screen assembly 1000 including: a display module 100. The display module 100 includes a display panel 20 and a touch panel 10 disposed on the display panel 20. The display module 100 has a first end 101. A first flexible circuit board 40 is disposed at the first end 101 of the display module 100. The first flexible circuit board 40 is electrically connected to the display panel 20 to drive the display panel 20 to implement a display function. A second flexible circuit board 30 is disposed on the first end 101 of the display module 100. The second flexible circuit board 30 is electrically connected to the touch panel 10 to drive the touch panel 10 to implement a touch function. The second flexible circuit board 30 is disposed at one side of the first flexible circuit board 40, and the second flexible circuit board 30 includes a plurality of curved portions.

In some embodiments, the second flexible circuit board 30 extends in a squiggly manner along a horizontal direction from the first end 101.

In some embodiments, both ends of each of the curved portions are close to the first flexible circuit board 40, and a center of each of the curved portions is away from the first flexible circuit board 40.

Figure 2:
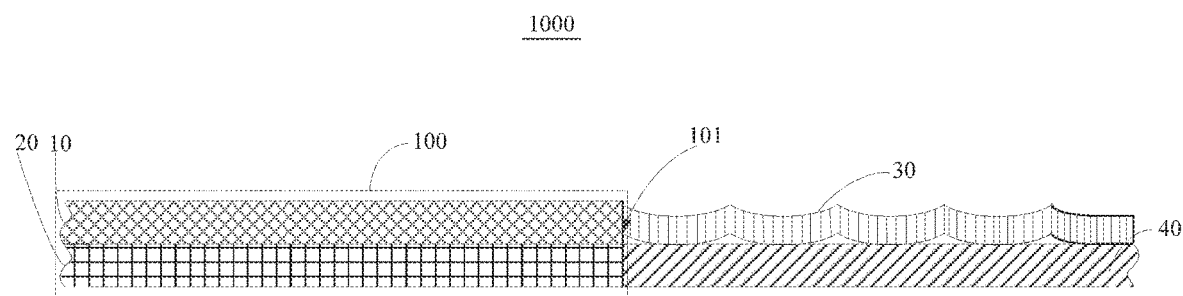
FIG. 2 is a schematic structural view of a display screen assembly provided by a second embodiment of the present invention.

As shown in FIG. 2, FIG. 2 is a schematic structural diagram of a display screen assembly according to a second embodiment of the present invention. In some embodiments, both ends of each of the curved portions are away from the first flexible circuit board 40, and a center of each of the curved portions is close to the first flexible circuit board 40.

Figure 3:
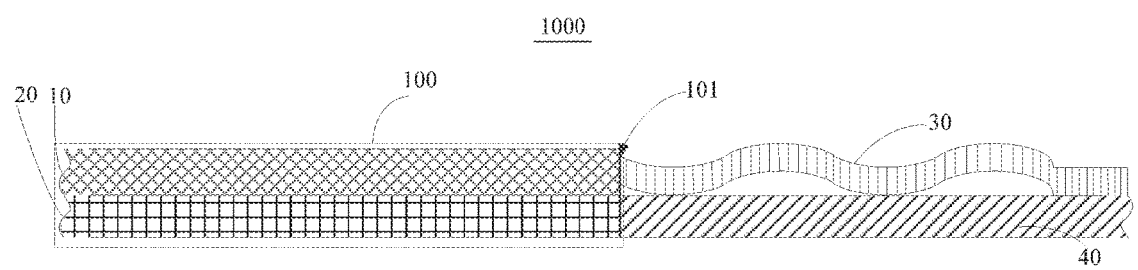
FIG. 3 is a schematic structural diagram of a display screen assembly provided by a third embodiment of the present invention.

As shown in FIG. 3, FIG. 3 is a schematic structural diagram of a display screen assembly according to a third embodiment of the present invention. In some embodiments, both ends of at least one of the curved portions are away from the first flexible circuit board 40, and a center of the at least one of the curved portions is close to the first flexible circuit board 40, while both ends of at least another one of the curved portions are close to the first flexible circuit board 40, and a center of the at least another one of the curved portions is away from the first flexible circuit board 40.

It should be noted that the embodiments of the present invention merely illustration a few shapes of the second flexible circuit board 30, and are not intended to limit the present invention.

In some embodiments, a height H2 of the second flexible circuit board 30 is less than or equal to a thickness H1 of the touch panel 10.

It can be understood that the height H2 of the second flexible circuit board 30 is less than or equal to the thickness H1 of the touch panel 10, so that the second flexible circuit board 30 is not higher than the surface of the touch panel 10 during the manufacturing process of the display screen assembly, and damages of the second flexible circuit board 30 can be prevented.

In some embodiments, a length of the second flexible circuit board 30 is the same as a length of the first flexible circuit board 40.

Because the length of the second flexible circuit board 30 is the same as the length of the first flexible circuit board 40, when the second flexible circuit board 30 connects to the first flexible circuit board 40, the second flexible circuit board 30 does not bulge.

In some embodiments, the length of the second flexible circuit board 30 after stretching is greater than the length of the first flexible circuit board 40.

It should be noted that in actual production, the first flexible circuit board 30 and the second flexible circuit board 40 need to be bent. Because the second flexible circuit board 30 is radially outward, the length of the second flexible circuit board 30 after stretching needs to be longer than the length of the first flexible circuit board 40, so that the second flexible circuit board 30 is not damaged during the bending process.

In the embodiment of the present invention, the second flexible circuit board 30 includes a plurality of curved portions. The length of the second flexible circuit board 30 is the same as the length of the first flexible circuit board 40. Further, it is ensured that the height H2 of the second flexible circuit board 30 is less than or equal to the thickness H1 of the touch panel 10. Since the length of the first flexible circuit board 40 is the same as the length of the second flexible circuit board 30, when the first flexible circuit board 40 is connected to the second flexible circuit board 30, the length of the second flexible circuit 30 is not greater than the length of the first flexible circuit board 40 to causes a bulge of the second flexible circuit board 30. Although the second flexible circuit board 30 includes the plurality of curved portions, the height H2 of the second flexible circuit board 30 in the embodiment of the present invention is less than or equal to the thickness H1 of the touch panel 10. Therefore, the second flexible circuit board 30 is not damaged in the subsequent process.

Figure 4:
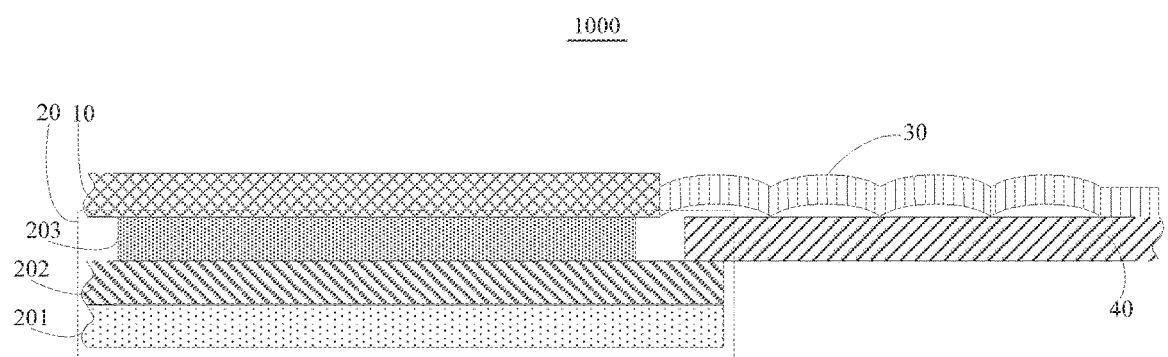
FIG. 4 is a schematic structural view of a display screen assembly provided by a fourth embodiment of the present invention.

As shown in FIG. 4, FIG. 4 is a schematic structural diagram of a display screen assembly according to a fourth embodiment of the present invention. In some embodiments, the display panel 20 further includes a back plate 201, a low temperature polysilicon 202, and a display assembly 203 stacked sequentially from bottom to top. The display component 203 generally includes an organic light emitting diode (OLED) light emitting device and an encapsulation film layer disposed on the OLED light emitting device.

In some embodiments, the encapsulation film layer includes a first inorganic layer, an organic layer, and a second inorganic layer. The first inorganic layer and the second inorganic layer are generally prepared by chemical vapor deposition (CVD). The organic layer is prepared by ink jet printing (IJP).

In some embodiments, the first flexible circuit board 40 is disposed at a side of the low temperature polysilicon 202.

In some embodiments, the second flexible circuit board 30 is disposed at a side of the touch panel 10.

Figure 5:
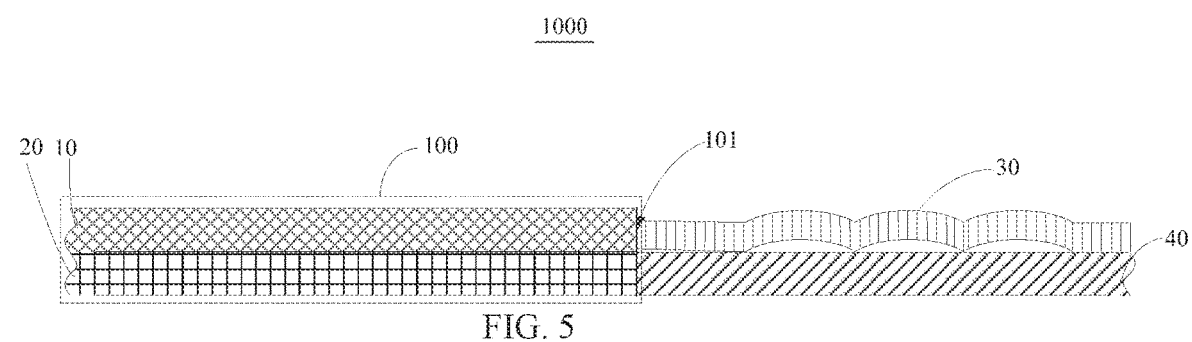
FIG. 5 is a schematic structural diagram of a display screen assembly provided by a fifth embodiment of the present invention.

Referring to FIG. 5, FIG. 5 is a schematic structural diagram of a display screen assembly according to a fifth embodiment of the present invention. The embodiment of the present invention provides a display screen assembly 1000 including a display module 100. The display module 100 includes a display panel 20 and a touch panel 10 disposed on the display panel 20. The display module 100 has a first end 101. The first flexible circuit board 40 is disposed at the first end 101 of the display module 100. The first flexible circuit board 40 is electrically connected to the display panel 20 to drive the display panel 20 to implement a display function. The second flexible circuit board 30 is disposed at the first end 101 of the display module 100. The second flexible circuit board 30 is electrically connected to the touch panel 10 to drive the touch panel 10 to implement a touch function. The second flexible circuit board 30 is disposed at one side of the first flexible circuit board 40, and the second flexible circuit board 30 includes a plurality of curved portions.

In some embodiments, the second flexible circuit board 30 further includes a non-curved portion.

In some embodiments, the non-curved portion is close to the side of the first end 101.

Because the height of the second flexible circuit board 30 at a connection site with the touch panel 10 is slightly higher than the height of the touch panel, the non-curved portion can be disposed at a side close to the first end 101 to reduce the height of the second flexible circuit board 30 close to the first end 101. The side of the second flexible circuit board 30 away from the first end 101 may include the plurality of curved portions, such that the length of the second flexible circuit board 30 is the same as the length of the first flexible circuit board 40, and thus the external circuit board does not bulge when the circuit board 30 is connected to the first flexible circuit board 40. Because the height of the second flexible circuit board 30 is less than or equal to the thickness of the touch panel 10, the second flexible circuit board 30 is not damaged by a flipping operation of the display screen during the manufacturing process of the display screen.

In some embodiments, on the premise that the non-curved portion is disposed at the side close to the first end 101, the non-curved portion may be disposed at the side close to the connection site, and the plurality of curved portions may be disposed between the non-curved portions to ensure the height of the second flexible circuit board 30 less than or equal to the thickness of the touch panel 10, and to realize a better connection between the second flexible circuit board 30 and the first flexible circuit board 40.

In some embodiments, the plurality of curved portions may be spaced apart from each other, and non-curved portions are disposed between adjacent ones of the plurality of curved portions.

In order to further describe the display screen assembly provided by an embodiment of the present invention, the following description will be made from a perspective of a method of manufacturing the display screen assembly. The method of manufacturing the display screen assembly is used to prepare the display screen assembly.

An embodiment of the present invention further provides a method for manufacturing a display screen assembly, including: providing a back plate on which a low temperature polysilicon, a OLED light emitting device, an encapsulation film layer and a touch panel are laminated sequentially from bottom to top; wherein a first flexible circuit board is disposed at one side of the low temperature polysilicon; a second flexible circuit board is disposed at one side of the touch panel, and the second flexible circuit board is disposed on the first flexible circuit board, and the second flexible circuit board includes a plurality of curved portions.

In the above embodiments, the descriptions of the various embodiments are all focused on, and the parts that are not detailed in a certain embodiment can be referred to the related descriptions of other embodiments.

The display module of the present invention is described in detail above. The principles and implementations of the present invention are described in the specific examples. While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display screen assembly, comprising:
a display module, comprising a display panel and a touch panel disposed on the display panel, the display module having a first end;
a first flexible circuit board disposed at the first end of the display module, and electrically connected to the display panel to drive the display panel to realize a display function; and
a second flexible circuit board disposed at the first end of the display module, and electrically connected to the touch panel to drive the touch panel to realize a touch function;
wherein the second flexible circuit board is disposed at one side of the first flexible circuit board, the second flexible circuit board comprises a plurality of curved portions, the second flexible circuit board extends away from the first end in a squiggly manner along a horizontal direction, both ends of at least one of the curved portions are away from the first flexible circuit board, and a center of the at least one of the curved portions is close to the first flexible circuit board.

2. The display screen assembly of claim 1, wherein both ends of each of the curved portions are close to the first flexible circuit board, and a center of each of the curved portions is away from the first flexible circuit board.

3. The display screen assembly of claim 1, wherein both ends of each of the curved portions are away from the first flexible circuit board, and a center of each of the curved portions is close to the first flexible circuit board.

4. The display screen assembly of claim 1, wherein both ends of at least another one of the curved portions are close to the first flexible circuit board, and a center of the at least another one of the curved portions is away from the first flexible circuit board.

5. The display screen assembly of claim 1, wherein a height of the second flexible circuit board is less than or equal to a thickness of the touch panel.

6. The display screen assembly of claim 1, wherein a length of the second flexible circuit board is equal to a length of the first flexible circuit board.

7. The display screen assembly of claim 6, wherein the length of the second flexible circuit board after stretching is greater than the length of the first flexible circuit board.

8. The display screen assembly of claim 1, wherein the second flexible circuit board further comprises a non-curved portion.

9. The display screen assembly of claim 8, wherein the non-curved portion is adjacent to a side of the first end.

10. A display screen assembly, comprising:
a display module, comprising a display panel and a touch panel disposed on the display panel, the display module having a first end;
a first flexible circuit board disposed at the first end of the display module, and electrically connected to the display panel to drive the display panel to realize a display function; and
a second flexible circuit board disposed at the first end of the display module, and electrically connected to the touch panel to drive the touch panel to realize a touch function;
wherein the second flexible circuit board is disposed at one side of the first flexible circuit board, and the second flexible circuit board comprises a plurality of curved portions and two non-curved portions, the plurality of the curved portions are disposed between the two non-curved portions, the second flexible circuit board extends away from the first end in a squiggly manner along a horizontal direction, both ends of at least one of the curved portions are away from the first flexible circuit board, and a center of the at least one of the curved portions is close to the first flexible circuit board.

11. The display screen assembly of claim 10, wherein both ends of each of the curved portions are close to the first flexible circuit board, and a center of each of the curved portions is away from the first flexible circuit board.

12. The display screen assembly of claim 10, wherein both ends of each of the curved portions are away from the first flexible circuit board, and a center of each of the curved portions is close to the first flexible circuit board.

13. The display screen assembly of claim 10, wherein both ends of at least another one of the curved portions are close to the first flexible circuit board, and a center of the at least another one of the curved portions is away from the first flexible circuit board.

14. The display screen assembly of claim 10, wherein a height of the second flexible circuit board is less than or equal to a thickness of the touch panel.

15. The display screen assembly of claim 10 wherein a length of the second flexible circuit board is equal to a length of the first flexible circuit board.

16. The display screen assembly of claim 15, wherein the length of the second flexible circuit board after stretching is greater than the length of the first flexible circuit board.

* * * * *